(12) United States Patent
Lai et al.

(10) Patent No.: US 9,530,784 B1
(45) Date of Patent: Dec. 27, 2016

(54) MEMORY DEVICE AND METHOD FOR FABRICATING THE SAME

(71) Applicant: MACRONIX International Co., Ltd., Hsinchu (TW)

(72) Inventors: Hsiang-Yu Lai, Hsinchu (TW); Zu-Sing Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/743,697

(22) Filed: Jun. 18, 2015

(51) Int. Cl.
*H01L 29/792* (2006.01)
*H01L 27/115* (2006.01)
*H01L 21/28* (2006.01)

(52) U.S. Cl.
CPC ... *H01L 27/11568* (2013.01); *H01L 21/28282* (2013.01)

(58) Field of Classification Search
CPC .............. H01L 27/11568; H01L 21/28282
See application file for complete search history.

(56) References Cited

U.S. PATENT DOCUMENTS

| 2013/0248978 A1* | 9/2013 | Sakaguchi | H01L 27/11524 257/326 |
| 2015/0076586 A1* | 3/2015 | Rabkin | G11C 16/0483 257/324 |

FOREIGN PATENT DOCUMENTS

| TW | 200719440 | 5/2007 |
| TW | 201505128 | 2/2015 |

OTHER PUBLICATIONS

"Office Action of Taiwan Counterpart Application", issued on Jun. 3, 2016, p. 1-p. 6.

* cited by examiner

*Primary Examiner* — Shaun Campbell
(74) *Attorney, Agent, or Firm* — J.C. Patents

(57) ABSTRACT

Provided is a memory device including a stack structure, a plurality of first cap layers, and a plurality of second cap layers. The stack structure is located on a substrate. The stack structure includes a plurality of first conductive layers and a plurality of dielectric layers. The first conductive layers and the dielectric layers are stacked alternately. The first cap layers are located on sidewalls of the first conductive layers respectively. The second cap layers are located on sidewalls of the dielectric layers respectively.

11 Claims, 6 Drawing Sheets

MEMORY DEVICE AND METHOD FOR FABRICATING THE SAME

BACKGROUND OF THE INVENTION

1. Field of the Invention

The invention relates to a semiconductor device and a method for fabricating the same, and particularly relates to a memory device and a method for fabricating the same.

2. Description of Related Art

With the continuous development of science and technology, the demands to the storage capability also increase as the electronic products continue to improve. To improve the storage capability, memory devices become smaller and have a greater integrity. Thus, the industries now highly focus on three-dimensional memory devices.

However, as the integrity of the three-dimensional memory devices increases, the surface force (e.g., a capillary force, a friction force, and an adhesive force) may significantly influence the stability of the structure of the three-dimensional memory devices due to a high surface-area-to-volume ratio. The influence is particularly significant to the devices having a high aspect ratio. Thus, how to develop a memory device and a method for fabricating the same to prevent the device structure having a high aspect ratio from being bent or collapsing is becoming an issue to work on.

SUMMARY OF THE INVENTION

The invention provides a memory device having cap layers and a method for fabricating the same capable of preventing a device structure having a high aspect ratio from being bent or collapsing.

The invention provides a memory device including a stack structure, a plurality of first cap layers, and a plurality of second cap layers. The stack structure is located on a substrate. The stack structure includes a plurality of first conductive layers and a plurality of dielectric layers alternately stacked with respect to each other. The first cap layers are respectively located on sidewalls of the first conductive layers. The second cap layers are respectively located on sidewalls of the dielectric layers.

According to an embodiment of the invention, a material of the first cap layers is the same as a material of the second cap layers.

According to an embodiment of the invention, a material of the first cap layers is different from a material of the second cap layers.

According to an embodiment of the invention, a material of the first cap layers and a material of the second cap layers include a nitrogen-containing material.

According to an embodiment of the invention, the nitrogen-containing material includes silicon nitride, silicon oxynitride, or a combination thereof.

According to an embodiment of the invention, the memory device further includes a second conductive layer and a charge storage layer. The second conductive layer covers the stack structure. The charge storage layer is located between the stack structure and the second conductive layer. The first cap layers are respectively located between the first conductive layers and the charge storage layer. The second cap layers are respectively located between the dielectric layers and the charge storage layer.

According to an embodiment of the invention, a material of the first cap layers is the same as a portion of materials of the charge storage layer. A material of the second cap layers is different from a portion of the materials of the charge storage layer.

According to an embodiment of the invention, one of the first conductive layers and the second conductive layer is a plurality of gate layers. The other of the first conductive layers and the second conductive layer is a plurality of channel layers.

The invention provides a memory device including a stack structure, a second conductive layer, and a charge storage structure. The stack structure is located on a substrate. The stack structure includes a plurality of first conductive layers and a plurality of dielectric layers alternately stacked with respect to each other. The second conductive layer covers the stack structure. The charge storage structure is located between the stack structure and the second conductive layer. The charge storage structure includes a plurality of first parts and a plurality of second parts. The first parts are located on sidewalls of the first conductive layers. The second parts are located on sidewalls of the dielectric layers. Structures of the first parts at least partially differ from structures of the second parts.

According to an embodiment of the invention, the first parts include silicon nitride/silicon oxide/silicon nitride/silicon oxide.

According to an embodiment of the invention, the second parts include silicon oxynitride/silicon oxide/silicon nitride/silicon oxide.

The invention provides a method for fabricating a memory device, and the method including steps as follows. A stack structure is formed on a substrate. The stack structure includes a plurality of first conductive layers and a plurality of dielectric layers. The first conductive layers and the dielectric layers are alternately stacked with respect to each other. A plurality of first cap layers are respectively formed on sidewalls of the first conductive layers, and a plurality of second cap layers are respectively formed on sidewalls of the dielectric layers.

According to an embodiment of the invention, a process for respectively forming the first cap layers on the sidewalls of the first conductive layers and respectively forming the second cap layers on the sidewalls of the dielectric layers includes performing a surface treatment process.

According to an embodiment of the invention, the surface treatment process includes a nitridation process, an oxynitridation process, or a combination thereof.

According to an embodiment of the invention, the nitridation process includes a plasma process, a chemical vapor deposition process, a physical vapor deposition process, or a combination thereof.

According to an embodiment of the invention, a material of the first cap layers is different from a material of the second cap layers.

According to an embodiment of the invention, a material of the first cap layers and a material of the second cap layers include a nitrogen-containing material.

According to an embodiment of the invention, the nitrogen-containing material includes silicon nitride, silicon oxynitride, or a combination thereof.

According to an embodiment of the invention, the memory device for fabricating the same further includes steps as follows. A second conductive layer is formed on surfaces of the stack structure, the first cap layers, and the second cap layers. The second conductive layer covers the stack structure. A charge storage layer is formed between the stack structure and the second conductive layer.

According to an embodiment of the invention, one of the first conductive layers and the second conductive layer is a plurality of gate layers. The other of the first conductive layers and the second conductive layer is a plurality of channel layers.

Based on above, the first cap layers and the second cap layers are used in the invention to respectively cover the sidewalls of the first conductive layers and the dielectric layers. Since the materials of the first cap layers and the second cap layers are a nitrogen-containing material that is stiffer, the first cap layers and the second cap layers may facilitate the stiffness of the whole stack structure of the invention, so as to prevent the stack structure having a high aspect ratio from being bent or collapsing.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
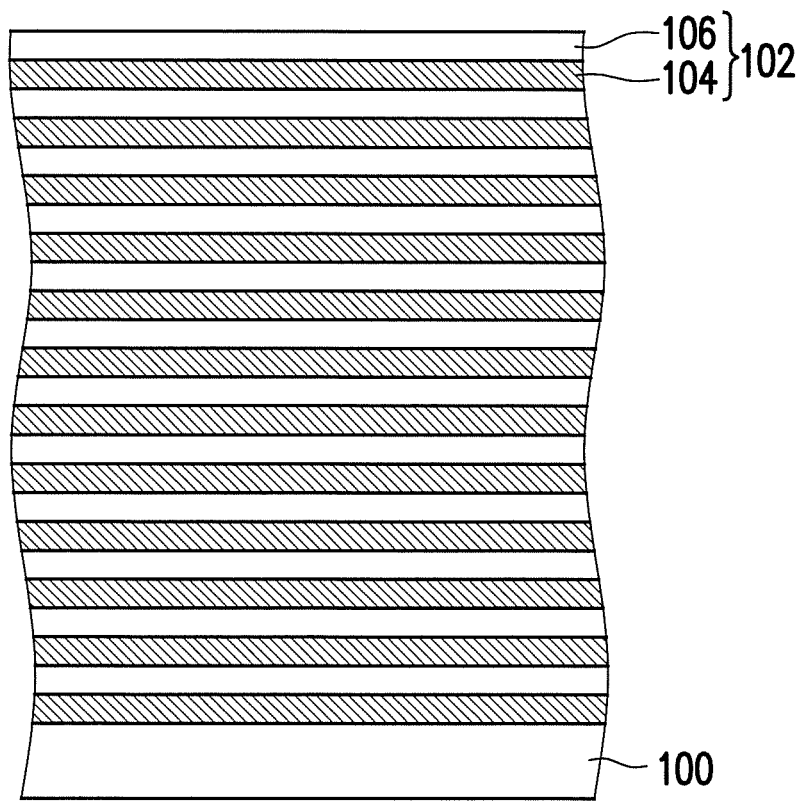
FIGS. 1A to 1F are cross-sectional views illustrating a method for fabricating a memory device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are cross-sectional views illustrating a method for fabricating a memory device according to an embodiment of the invention.

Referring to FIG. 1A, first of all, a substrate 100 is provided. The substrate 100 may be a semiconductor substrate, a semiconductor compound substrate, or a semiconductor over insulator (SOI) substrate, for example. The semiconductor is IVA group atoms, such as silicon or germanium, for example. The semiconductor compound is formed of IVA group atoms, such as silicon carbide or silicon germanium, or formed of IIIA group atoms and VA group atoms, such as gallium arsenide, for example.

Then, a stack layer 102 is formed on the substrate 100. The stack layer 102 includes a plurality of conductive layers 104 and a plurality of dielectric layers 106. The conductive layers 104 and the dielectric layers 106 are alternately stacked with respect to each other. In an embodiment, a material of the conductive layers 104 may be doped polysilicon, undoped polysilicon, or a combination thereof, for example, and a method of forming the conductive layers 104 may include performing a chemical vapor deposition process. A thickness of the conductive layers 104 may be in a range from 100 nm to 500 nm, for example. A material of the dielectric layers 106 may be silicon oxide, silicon nitride, or a combination thereof, for example, and a method of forming the dielectric layers 106 may include performing a chemical vapor deposition process. A thickness of the dielectric layers 106 may be in a range from 100 nm to 500 nm, for example. Even though FIG. 1A only illustrates twelve conductive layers 104 and twelve dielectric layers 106, the invention is not limited thereto. In other embodiments, the number of the conductive layers 104 may be 8, 16, 32, or more, for example. Similarly, one of the dielectric layers 106 is disposed between two adjacent conductive layers 104. Thus, the number of the dielectric layers 106 may also be 8, 16, 32, or more, for example.

Figure 1B:
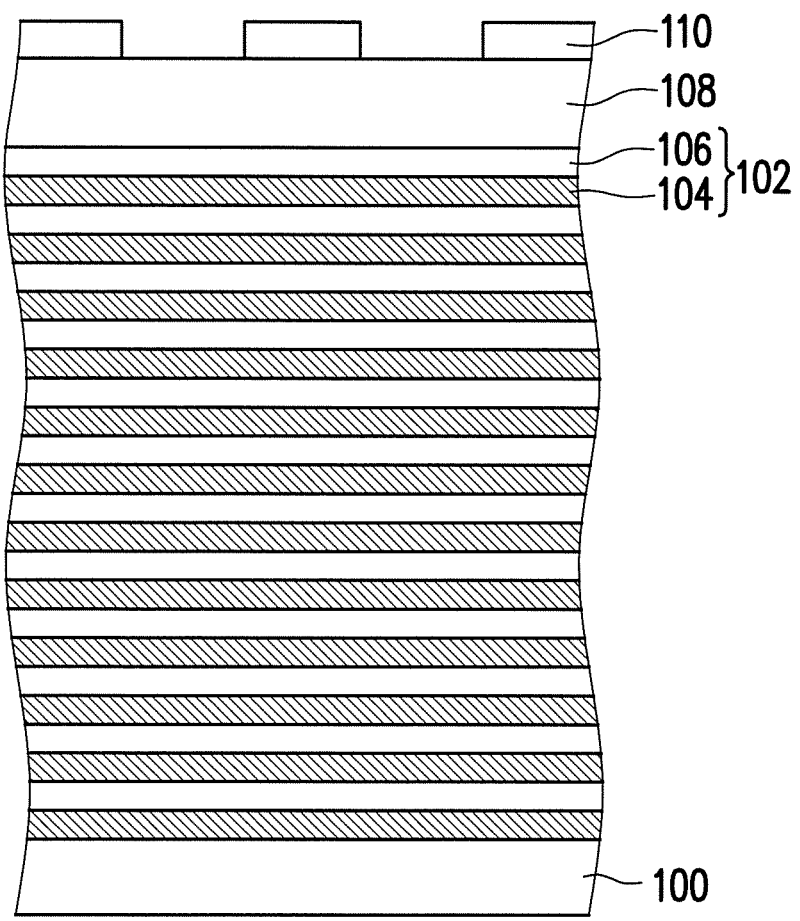

Then, referring to FIGS. 1A and 1B, a mask layer 108 and a patterned mask layer 110 are sequentially formed on the stack layer 102. In an embodiment, the mask layer 108 may be an advanced patterning film (APF). A material of the advanced patterning film may include a carbon-containing material, and the carbon-containing material may be amorphous carbon, for example. A material of the patterned mask layer 110 may be a positive photoresist material or a negative photoresist material, for example. The patterned mask layer 110 may be formed by performing a photolithography process.

Figure 1C:
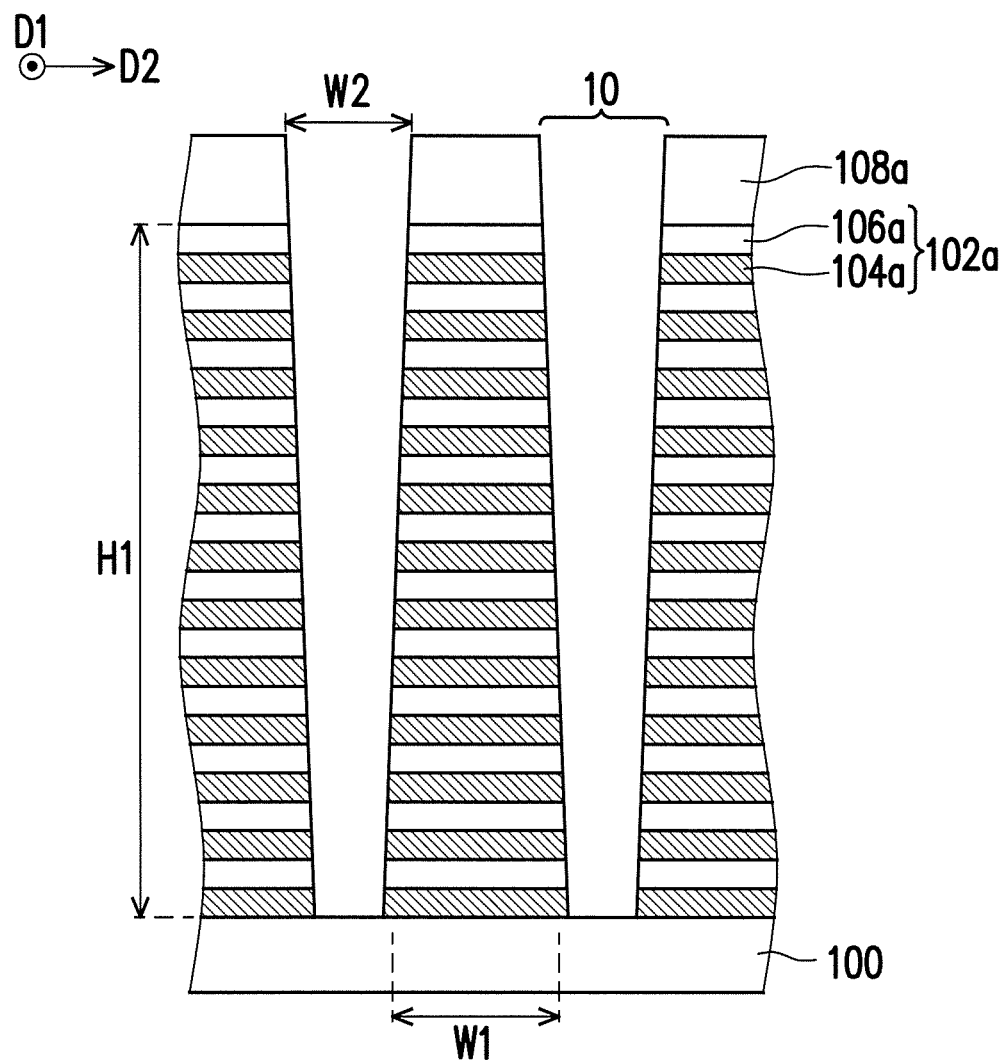

Referring to FIGS. 1B and 1C, using the patterned mask layer 110 as a mask, an etching process is performed on the mask layer 108 to remove a portion of the mask layer 108, thereby forming a patterned mask layer 108a. Then, using the patterned mask layer 108a as a mask, an etching process is performed on the stack layer 102 to remove a portion of the conductive layers 104 and a portion of the dielectric layers 106 to form a plurality of openings 10 and a plurality of stack structures 102a. In an embodiment, the openings 10 expose a surface of the substrate 100. The stacked structures 102a extend along a first direction D1 (i.e., a direction perpendicular to the paper), and the stack structures 102a and the openings 10 are alternately arranged along a second direction D2. In an embodiment, the first direction D1 differs from the second direction D2, and the first and second directions D1 and D2 are perpendicular to each other. When performing the etching process, the patterned mask 110 may be worn out. Thus, the patterned mask layer 108a may remain on the stack structures 102a (as shown in FIG. 1C). In this embodiment, an aspect ratio (H1/W1) of the stack structures 102a may be in a range from 10 to 50. A width W2 of the openings 10 may be less than 150 nm.

Figure 1D:
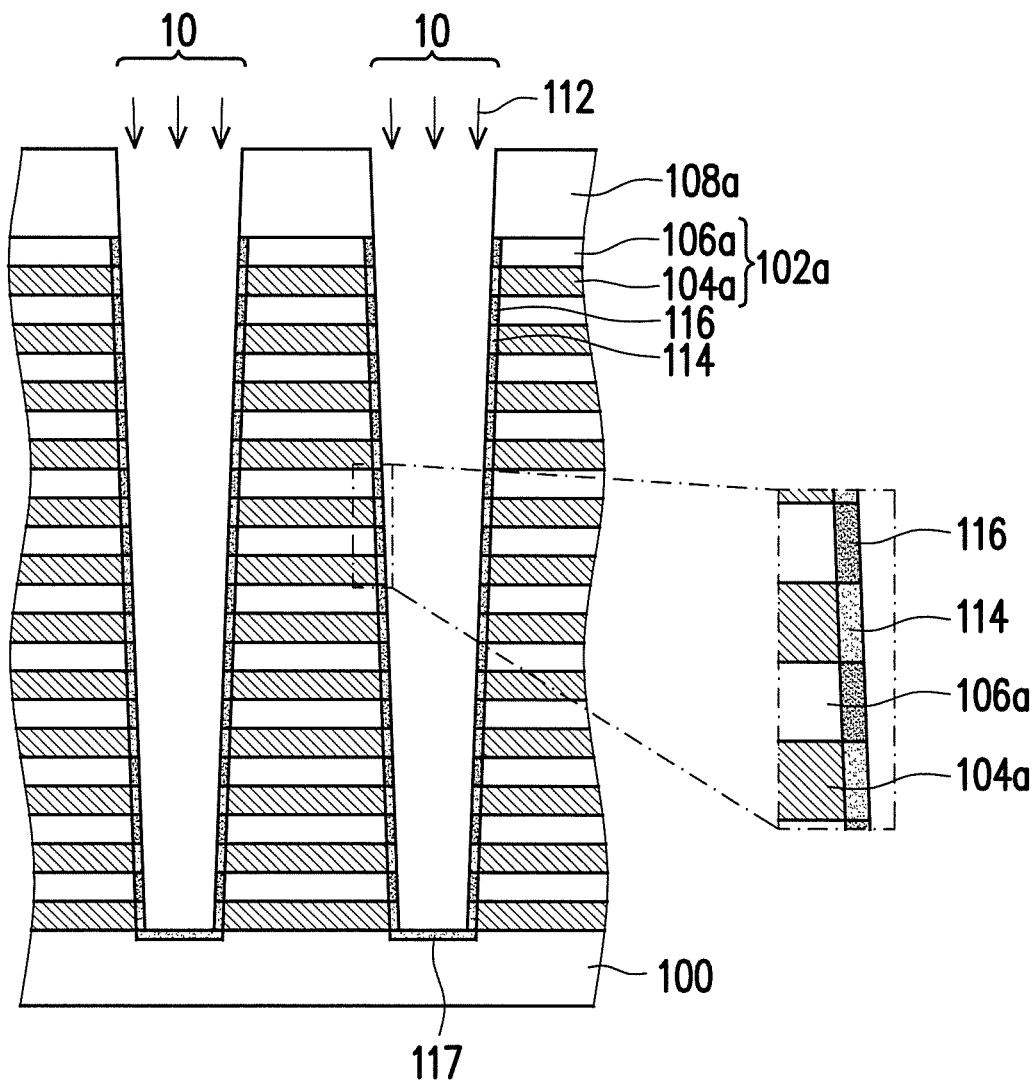

Referring to FIG. 1D, a surface treatment process 112 is performed, so as to form first cap layers 114 or second cap layers 116 on sidewalls of conductive layers 104a in the openings 10 respectively. In an embodiment, when performing the surface treatment process 112, the second cap layers 116 or the first cap layers 114 may be simultaneously and respectively formed on sidewalls of dielectric layers 106a in the openings 10 respectively. Besides, in another embodiment, when performing the surface treatment process 112, third cap layers 117 may be simultaneously and respectively formed on the surface of the substrate 100 at a bottom part of the openings 10. The surface treatment process 112 includes a nitridation process, an oxynitridation process, or a combination thereof. The nitridation process may be a plasma process, a chemical vapor deposition process, a physical vapor deposition process, or a combination thereof. In an embodiment, the surface treatment process 112 is an $N_2$ plasma treatment, where a nitrogen-containing gas at a flow rate from 10 sccm to 500 sccm is introduced into a high-vacuum chamber to perform a plasma process under a reaction chamber temperature in a range from 20° C. to 70° C. In this embodiment, the nitrogen-containing gas may be $N_2$, $NH_3$ or a combination thereof, for example. However, the invention is not limited thereto. It is not departed from the spirit of the invention as long as the stack structures 102a are not removed or only a limited portion of the stack structures 102a is removed and cap layers are formed on the sidewalls of the stack structures 102a in the surface treatment process. In an embodiment, materials of the first cap layers 114, the second cap layers 116, and the third cap layers 117 may be the same or different. The materials of the first cap layers 114, the second cap layers 116, and the third cap layers 117 include a nitrogen-containing material, and the nitrogen-containing material may be silicon nitride, silicon oxynitride, or a combination thereof, for example. In an embodiment, the conductive layers 104a may be polysilicon, the dielectric layers 106a may be silicon nitride, the first cap layers 114 may be silicon nitride, the second cap layers 116 may be silicon oxynitride, and the third cap layers 117 may be silicon nitride. A thickness of the first cap layers 114 may be 1 nm to 5 nm, for example. A thickness of the second cap layers 116 may be 1 nm to 5 nm, for example. A thickness of the third cap layers 117 may be 1 nm to 5 nm, for example.

Figure 1E:
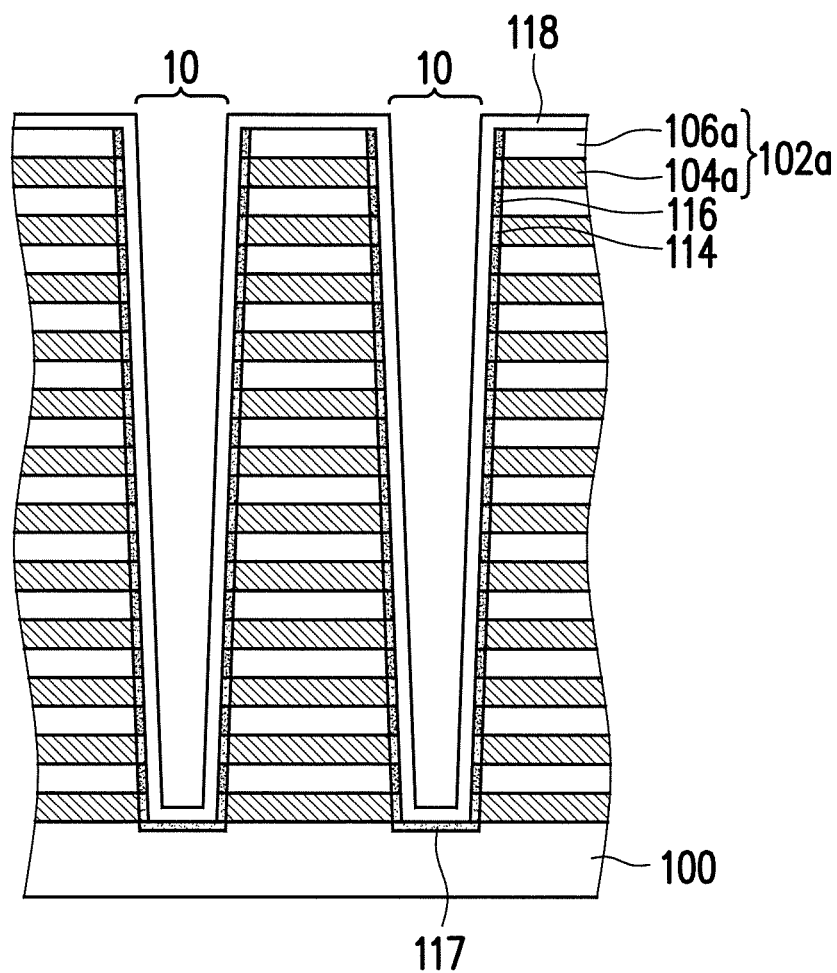

Referring to FIGS. 1D to 1E, the patterned mask layer 108a is removed. Then, a charge storage layer 118 is formed on the stack structures 102a, the first cap layers 114, the second cap layers 116 and the third cap layers 117. In an embodiment, the charge storage layer 118 is conformally formed on surfaces of the stack structures 102a, the first cap layers 114, the second cap layers 116 and the third cap layers 117. In an embodiment, the charge storage layer 118 may be a composite layer formed of oxide/nitride/oxide (ONO). The composite layer may include three or more layers, for example. However, the invention is not limited thereto. A method of forming the charge storage layer 118 may include performing a chemical vapor deposition process, for example.

It should be noted that, since the first cap layers 114 and the second cap layers 116 are respectively formed on the sidewalls of the first conductive layers 104a and the dielectric layers 106a before the patterned mask layer 108a is removed, the first and second cap layers 114 and 116 may reinforce a strength of the whole stack structures 102a. Thus, when the mask layer 108a is removed, an influence of a surface force (e.g., a capillary force, a friction force, and an adhesive force) on the stack structures 102a in this process is reduced, thereby maintaining a stability of the stack structures 102a.

Figure 1F:
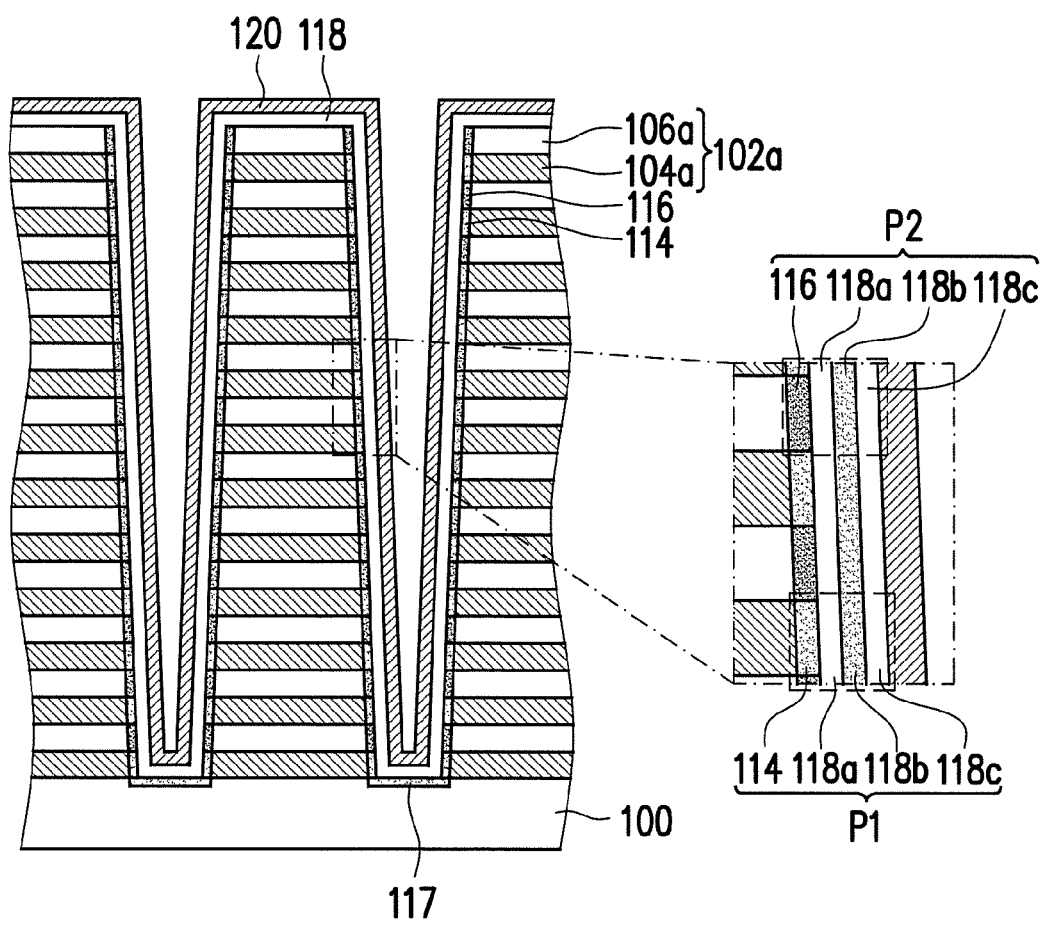

Then, referring to FIGS. 1E and 1F, a conducive layer 120 is formed on the charge storage layer 118. In an embodiment, the conductive layer 120 is conformally formed on the charge storage layer 118. However, the invention is not limited thereto. In other embodiments, the conductive layer 120 may also fill the openings 10. A material of the conductive layer 120 may be doped polysilicon, undoped polysilicon, or a combination thereof, for example, and a method of forming the conductive layer 120 may include performing a chemical vapor deposition process. A thickness of the conductive layer 120 may be in a range from 10 nm to 20 nm, for example. A subsequent process may include steps such as a step of further patterning the conductive layer 120. However, details in this respect are not described in the following.

Referring to FIG. 1F, the invention provides the memory device including the stack structures 102a, the charge storage layer 118, the conductive layer 120, the first cap layers 114, and the second cap layers 116. The stack structures 102a are located on the substrate 100. The stack structures 102a include the conductive layers 104a and the dielectric layers 106a. The conductive layers 104a and the conductive layers 106a are alternately stacked with respect to each other. In an embodiment, the conductive layers 104a may be a gate layer (also referred to as a word line), for example, and the conductive layer 120 may be a channel layer (also referred to as a bit line), for example. However, the invention is not limited thereto. In other embodiments, the conductive layers 104a may also be a channel layer (also referred to as a bit line), for example, and the conductive layer 120 may be a gate layer (also referred to as a word line). The first cap layers 114 are located on the sidewalls of the conductive layers 104a. The second cap layers 116 are located on the sidewalls of the dielectric layers 106a. The charge storage layer 118 is located on the surfaces of the stack structures 102a, the first cap layers 114, and the second cap layers 116. The second conductive layer 120 is located on the charge storage layer 118. In an embodiment, the first cap layers 114 and a portion of the charge storage layer 118 covering the first cap layers 114 may be referred to as first parts P1. The second cap layers 116 and a portion of the charge storage layer 118 covering the second cap layers 116 may be referred to as second parts P2. A structure of the first parts P1 and a structure of the second parts P2 are at least partially different. In an embodiment, the structure of the first parts P1 may be formed of silicon nitride 114/silicon oxide 118a/silicon nitride 118b/silicon oxide 118c (in an extending direction from the surface of the stack structures 102a toward the charge storage layer 118), for example, while the structure of the second parts P2 may be formed of silicon oxynitride 116/silicon oxide 118a/silicon nitride 118b/silicon oxide 118c, for example. However, the invention is not limited thereto. Compared with the dielectric layers 106a, the materials of the first cap layers 114 and the second cap layers 116 are stiffer. The Young's Module thereof may be in a range from 220 GPa to 270 GPa, for example. Thus, the first cap layers 114 and the second cap layers 116 may facilitate a stiffness of the whole stack structures 102a, so as to reduce the influence of the surface force (e.g., a capillary force, a friction force, and an adhesive force), thereby preventing the stack structure having a high aspect ratio from being bent or collapsing.

Also, under a circumstance that one of the conductive layers 104a is a word line, and the conductive layer 120 is a bit line, in an erase operation, since the first cap layers 114 on the surfaces of the conductive layers 104a have a certain thickness, the first cap layers 114 may prevent gate injection of electrons into the charge storage layer 118, so as to improve the window in the erase operation.

In view of the foregoing, the first cap layers and the second cap layers are used in the invention to respectively cover the sidewalls of the first conductive layers and the dielectric layers. Since the materials (e.g., the nitrogen-containing material) of the first cap layers and the second cap layers are stiffer, the first cap layers and the second cap layers may facilitate the stiffness of the whole stack structure of the invention, so as to reduce the influence of the surface force (e.g., a capillary force, a friction force, and an adhesive force), thereby preventing the stack structure having a high aspect ratio from being bent or collapsing. Moreover, the first cap layer on the surface of the conductive layer may also prevent gate injection of electrons into the charge storage layer, so as to improve the window in the erase operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory device, comprising:
   a plurality of stack structures, located on a substrate, wherein each of the plurality of stack structures comprises a plurality of first conductive layers and a plurality of dielectric layers alternately stacked with respect to each other, and each of the adjacent stack structures are separated by an opening;
   a plurality of first cap layers, respectively located on sidewalls of the first conductive layers;
   a plurality of second cap layers, respectively located on sidewalls of the dielectric layers;
   a second conductive layer, extends continuously along a second direction to cover the stack structure; and
   a charge storage layer, located between the substrate and the second conductive layer, and between the stack structure and the second conductive layer, wherein the charge storage layer covers sidewalls and top surfaces of the plurality of stack structures and bottoms of the openings to isolate the second conductive layer and the plurality of stack structures, and isolate the second conductive layer and the substrate,
   wherein each of the plurality of stack structures extends along a first direction, the plurality of stack structures and a plurality of openings are alternately arranged along the second direction, each of the plurality of openings extends along the first direction, and the first and second directions are different.

2. The memory device as claimed in claim 1, wherein a material of the first cap layers is the same as a material of the second cap layers.

3. The memory device as claimed in claim 1, wherein a material of the first cap layers is different from a material of the second cap layers.

4. The memory device as claimed in claim 1, wherein a material of the first cap layers and a material of the second cap layers comprise a nitrogen-containing material.

5. The memory device as claimed in claim 4, wherein the nitrogen-containing material comprises silicon nitride, silicon oxynitride, or a combination thereof.

6. The memory device as claimed in claim 1,
   wherein the first cap layers are respectively located between the first conductive layers and the charge storage layer, and the second cap layers are respectively located between the dielectric layers and the charge storage layer.

7. The memory device as claimed in claim 6, wherein a material of the first cap layers is the same as a portion of materials of the charge storage layer, and a material of the second cap layers is different from a portion of the materials of the charge storage layer.

8. The memory device as claimed in claim 6, wherein one of the first conductive layers and the second conductive layer is a plurality of gate layers, and the other of the first conductive layers and the second conductive layer is a plurality of channel layers.

9. A memory device, comprising:
   a plurality of stack structures, located on a substrate, wherein each of the plurality of stack structures comprises a plurality of first conductive layers and a plurality of dielectric layers alternately stacked with respect to each other, and each of the adjacent stack structures are separated by an opening;
   a second conductive layer, covering the entire stack structure; and
   a charge storage structure, located between the stack structure and the second conductive layer, and between the substrate and the second conductive layer, wherein the charge storage structure comprises:
   a plurality of first parts, located on sidewalls of the first conductive layers; and
   a plurality of second parts, located on sidewalls of the dielectric layers, wherein structures of the first parts at least partially differ from structures of the second parts,
   wherein the charge storage structure covers sidewalls and top surfaces of the plurality of stack structures and bottoms of the openings to isolate the second conductive layer and the plurality of stack structures, and isolate the second conductive layer and the substrate,
   wherein each of the plurality of stack structures extends along a first direction, the plurality of stack structures and a plurality of openings are alternately arranged along a second direction, each of the plurality of openings extends along the first direction, and the first and second directions are different.

10. The memory device as claimed in claim 9, wherein the first parts comprise silicon nitride, silicon oxide, silicon nitride, and silicon oxide in an extending direction from a surface of the stack structure toward the second conductive layer.

11. The memory device as claimed in claim 9, wherein the second parts comprise silicon oxynitride, silicon oxide, silicon nitride, and silicon oxide in an extending direction from a surface of the stack structure toward the second conductive layer.

* * * * *